United States Patent [19]

Chen

[11] 4,091,362
[45] May 23, 1978

[54] BIAS STRUCTURE TO EFFICIENTLY PACKAGE A MAGNETIC BUBBLE DOMAIN DEVICE

[75] Inventor: Thomas T. Chen, Yorba Linda, Calif.

[73] Assignee: Rockwell International Corporation, El Segundo, Calif.

[21] Appl. No.: 736,037

[22] Filed: Oct. 27, 1976

Related U.S. Application Data

[63] Continuation of Ser. No. 587,466, Jun. 16, 1975, abandoned.

[51] Int. Cl.² .............................................. G11C 19/08
[52] U.S. Cl. ........................................... 365/1; 365/27
[58] Field of Search .................................. 340/174 TF

[56] References Cited

U.S. PATENT DOCUMENTS 4,001,792  1/1977  Tench .............................. 340/174 TF
4,027,298  5/1977  Michaelis ....................... 340/174 TF

OTHER PUBLICATIONS

IEEE Transactions on Magnetics-vol. Mag-9, No. 3, Sep. 1973, pp. 436-440.

Primary Examiner—James W. Moffitt
Attorney, Agent, or Firm—H. Fredrick Hamann; G. Donald Weber, Jr.; Morland C. Fischer

[57] ABSTRACT

A single, compact bias structure to efficiently package a plurality of magnetic bubble domain device chips having different bias requirements. The vertical magnetic field distribution within the bias structure air gap is selectively controlled by a magnetically soft field adjusting assembly suitably attached within the bias structure. The size and configuration of the field adjusting assembly tailors local field variations within the air gap to correspond with the bias requirements of the bubble domain chips disposed therein.

9 Claims, 2 Drawing Figures

BIAS STRUCTURE TO EFFICIENTLY PACKAGE A MAGNETIC BUBBLE DOMAIN DEVICE

The invention described herein was made in the performance of work under NASA Contract No. NAS 1-12435 and is subject to the provisions of Section 305 of the National Aeronautics and Space Act of 1958 (72 Stat. 435; 42 U.S.C. 2457).

CROSS REFERENCES TO RELATED PATENT APPLICATIONS

This patent application is a continuation of Ser. No. 587,466, filed June 16, 1975, and now abandoned.

BACKGROUND OF THE INVENTION

1. Field of the Invention

This invention relates to an improved magnetic bias structure which efficiently packages a plurality of magnetic bubble domain device chips having different bias requirements.

2. Description of the Prior Art

In the conventional magnetic bubble domain memory module, the required magnetic bias field is generated by inserting permanent magnets between two parallel flat plates of soft magnetic material to form a bias structure. A single uniform magnetic field is, thus, achieved in the center of the bias structure. One example of such a prior art arrangement can be found in U.S. Pat. No. 3,711,841 issued Jan. 16, 1973. The area around the perimeter of the magnets and close to the boundary of the bias plates is highly unsuitable for magnetic bubble domain chip placement, because of the fringing field effect. Therefore, to minimize the unusable area in a bias structure and, thus, reduce the size and weight of the bubble module, it is desirable to use a single bias structure which can accommodate many different memory chips. However, there are several problems associated with a large bias structure. First, a uniform magnetic field is difficult to achieve within the structure, because of the finite permeability of the bias plates. Moreover, because only a single bias field intensity can be obtained at any one time in the conventional structure, all of the chips are required to be operated under the same bias field conditions.

With present material and device processing technology, a large inventory of chips is required in order to provide chips having a bias requirement corresponding to the particular magnetic field conditions available within the bias structure. This requirement greatly limits the tolerance in wafer and device processing, and consequently requires that a large number of chips be sorted into matched groups according to their respective biasing requirements. Therefore, the result is to undesirably necessitate the use of several bias structures per bubble module in order to accommodate a large number of chips having various bias requirements.

SUMMARY OF THE INVENTION

Briefly, and in general terms, a single bias structure for efficiently packaging an array of magnetic bubble domain device chips having different bias requirements in a variable magnetic field is disclosed. The bias structure is comprised of top and bottom bias plates and permanent magnet means suitably arranged to define a bias structure air gap therebetween. The magnet means are magnetized in the same direction so as to produce a vertical magnetic field within the air gap.

In accordance with the instant invention, a magnetic field adjusting assembly is removably attached within the air gap of the bias structure. The assembly is fabricated from a magnetically soft material so that the reluctance thereof and the magnetic potential drop thereacross is negligible. The overall size and configuration of the field adjusting assembly is chosen so as to selectively tailor the local magnetic field distribution throughout the length of the air gap to correspond with the various biasing requirements of the bubble device chips positioned therein. Magnetic shunt means are also provided for continuous bias field adjustment in order to accurately adjust the magnetic field intensity throughout the bias structure air gap.

DESCRIPTION OF THE PREFERRED EMBODIMENT

Figure 1:
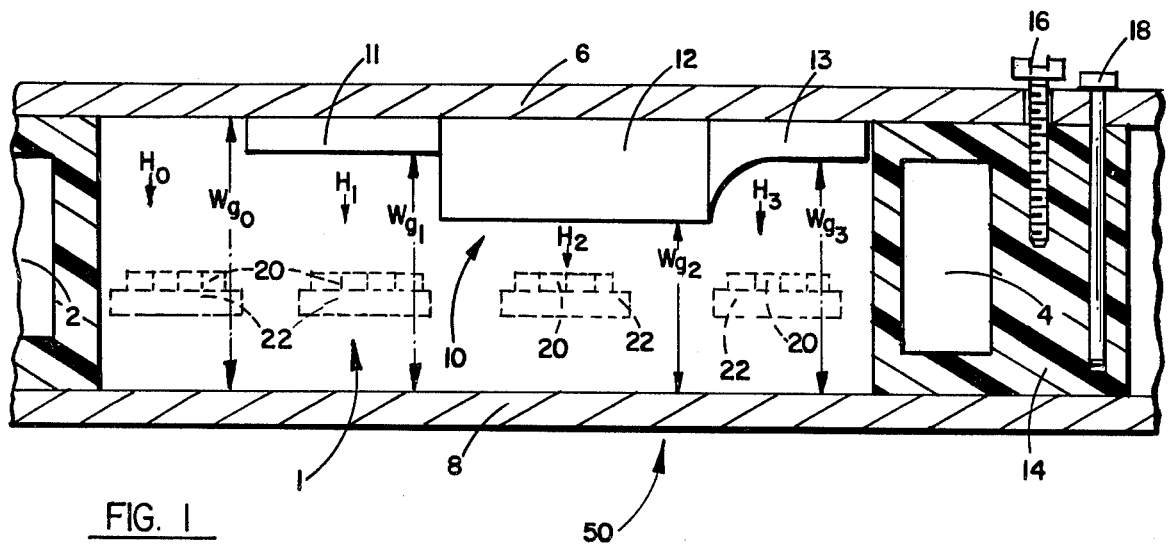
FIG. 1 is a partial cross-section showing an end view of the bias structure and magnetic field adjusting assembly of the instant invention.
Figure 2:
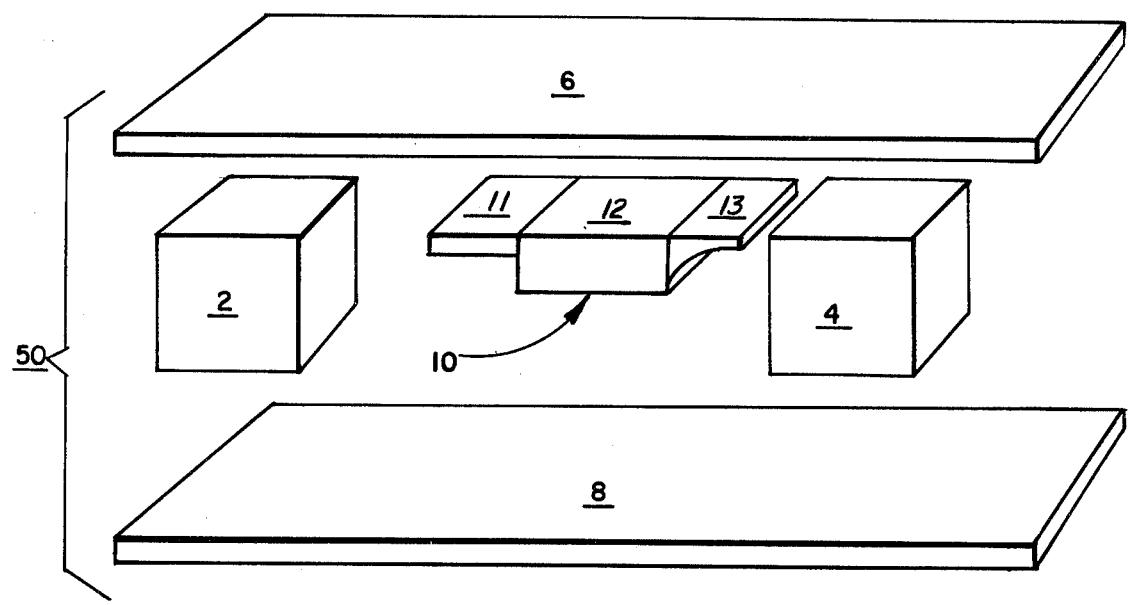
FIG. 2 is an expanded schematic of the instant bias structure of FIG. 1.

Referring to FIG. 1 of the drawings, the magnetic bias structure 50 of the instant invention is shown which both economically and efficiently packages an array of magnetic bubble domain means (i.e. a stable region of reversed magnetization in a thin film of magnetized material, such as, for example, an orthoferrite, garnet or other suitable material), wherein each of the devices may possess different magnetic biasing requirements. As also shown in FIG. 2, the instant bias structure 50 includes a pair of magnets 2 and 4 (e.g. permanent bar magnets) magnetized in the same direction so as to produce a vertical magnetic field therebetween. The magnets may be formed from a material such as, for example, barium ferrite or that known under the name of Alnico. The structure 50 also includes top and bottom bias plates 6 and 8, respectively, which are formed from a magnetically soft material (i.e. a material having a low coercivity and a low magnetic reluctance). Typically, plates 6 and 8 are formed of permalloy. A suitable array of magnetic bubble means 20 are disposed upon chips 22 and positioned in air gap 1, which is generally defined as the region formed between magnets 2 and 4 and bias plates 6 and 8.

In accordance with the instant invention, a magnetic field adjusting assembly 10 is arranged within the air gap 1 of the bias structure 50. The field adjusting assembly 10 is fabricated from a magnetically soft material, such as, for example, a mu-metal, a ferrite or the like. The field adjusting assembly 10 is removably attached to the top bias plate 6 by any suitable means, such as by mechanical bonding or by adhesive, such as epoxy. Although the field adjusting assembly 10 is shown secured to the top bias plate 6, it is to be understood that a field adjusting assembly may also be attached to the bottom bias plate 8, as well.

In a preferred embodiment of the invention, but not to be regarded as a limitation thereof, one example of a configuration for the instant field adjusting assembly 10 is shown. The assembly 10, which is comprised of representative flat and curved member 11, 12 and 13, selectively controls local vertical magnetic field intensities within air gap 1 in a manner as will be hereinafter described. It is to be understood, however, that the field adjusting assembly 10 may comprise any desirable configuration, including a flat plate or the like. Assembly 10 may comprise a plurality of sections or a unitary member.

If the field adjusting assembly 10 has sufficiently low coercivity so that the magnetic potential drop across the assembly is negligible (i.e. infinite permeability), the magnetic field distribution under the field adjusting assembly 10 is an inverse function of the respective local air gap widths according to the relationship:

$$H_oWg_o = H_1Wg_1 = H_2Wg_2 = \ldots H_nWg_n \quad (1)$$

$$H_o:H_1:H_2:\ldots H_n = 1/Wg_o:1/Wg_1:1/Wg_2:\ldots 1/Wg_n \quad (2)$$

or $$\Delta H_1/H_o = (H_1-H_o)/H_o = Wg_o-Wg_1/Wg_1 = \Delta Wg_1/Wg_1 \quad (3)$$

where $Wg_n$ = the width of the bias structure air gap at a particular position therein:

$H_n$ = the corresponding local magnetic field intensity at the respective position.

The local magnetic fields inside the bias structure 50 are selectively controlled by varying the air gap width according to equation (3). The size variation and location of the members comprising field adjusting assembly 10 are determined by the respective positions and the biasing requirements of the chips 22 disposed within the air gap 1. Because the localized areas of uniform field are limited to two or more relatively small regions within air gap 1, the actual effect caused by the finite permeability of the assembly 10 is substantially reduced.

Continuous bias field adjustment is also available in order to very accurately adjust the magnetic field to the desirable intensity and maintain the required local field distribution within the bias structure 50. The means for accurately adjusting the bias field may include either magnetically soft screw means 16 or pin means 18 extended in a direction corresponding to the width of the air gap 1, as shown. The magnetic shunt means 16 and 18 and the adjacent magnet 4 may be encased in a non-magnetic material (e.g. epoxy or aluminum) to form an integral magnetic structure 14. The effect of screw 16 and pin 18 is to establish a magnetic shunt path with respect to adjacent magnets 2 or 4 so as to proportionately reduce the flux ratio across the length of the air gap region 1 depending upon the extension of the shunt means relative to the magnets. The magnetic field distribution in the air gap region 1 can be controlled further according to the number and spacing of the shunts 16 and 18.

Because of the variable field in the air gap region, the bubble device chips packaged in the bias structure of the instant invention need not be identical or closely matched in the bias margin. This relaxes the memory chip specifications and, therefore, increases the chip processing yield. By virtue of the instant invention, a single and relatively compact bias structure is achieved for assembly within a bubble module having reduced overall weight and complexity as compared to conventional bubble modules. Moreover, the number of chips that can be packaged within the instant bias structure is substantially increased.

It will be apparent that while a preferred embodiment of the instant invention has been shown and described, various modifications and changes may be made without departing from the true spirit and scope of the invention. For example, the various materials which have been associated with the instant bias structure and the field adjusting assembly are for exemplary purposes only. It is to be understood that any suitable materials may be employed. What is more, the field adjusting assembly may have any desirable configuration corresponding with the chip biasing requirements and may be conveniently disposed on either or both the top and bottom bias plates of the instant bias structure.

Having thus set forth a preferred embodiment of the instant invention, what is claimed is:

1. In a magnetic bias structure including top and bottom bias plates and magnetic end means arranged to form an air gap therebetween, said air gap having length and width and adapted to receive at least one magnetic bubble domain means therein, the improvement comprising:
   bias field adjusting means disposed in said air gap to provide a plurality of uniform local magnetic fields, said bias field adjusting means having a configuration so as to selectively vary the width of said air gap relative to the length thereof to thereby selectively control the local bias field distribution throughout the length of said air gap.

2. A magnetic arrangement including:
   magnetic means for supplying a bias field;
   top and bottom bias members;
   air gap means formed between said magnet means and said top and bottom bias members, said air gap means having length and width; and
   bias field adjusting means to provide a plurality of uniform local magnetic fields in said air gap, said bias field adjusting means having a configuration to vary the width of said air gap means relative to the length thereof in order to selectively control the local bias field distribution within said air gap relative to the length of said air gap.

3. The magnetic arrangement recited in claim 1, including additional bias field adjusting means to provide a non-uniform local magnetic field in said air gap, said additional bias field adjusting means having a configuration to vary the width of said air gap relative to the length thereof.

4. The magnetic assembly recited in claim 1, wherein said bias field adjusting means is removably attached to at least one of said top and bottom bias members.

5. The magnetic arrangement recited in claim 1, wherein said bias field adjusting means is comprised of a magnetically soft material.

6. The magnetic arrangement recited in claim 5, wherein said magnetically soft material is a ferrite.

7. The magnetic assembly recited in claim 5, wherein said magnetically soft material is a mu-metal.

8. The magnetic assembly recited in claim 2, including means to form a magnetic shunt path with said magnet means to further selectively control the bias field distribution within said air gap relative to the length thereof.

9. The magnetic assembly recited in claim 8, wherein said means to form a magnetic shunt path is an elongated magnetically soft means positioned adjacent to said magnet means and extended in a direction corresponding to the width of said air gap.

* * * * *